United States Patent
Kim et al.

(10) Patent No.: US 7,492,637 B2
(45) Date of Patent: Feb. 17, 2009

(54) NONVOLATILE SEMICONDUCTOR MEMORY DEVICES

(75) Inventors: Jae-Hyun Kim, Suwon-si (KR); Jeong-Un Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/485,524

(22) Filed: Jul. 13, 2006

(65) Prior Publication Data

US 2007/0047317 A1  Mar. 1, 2007

(30) Foreign Application Priority Data

Aug. 23, 2005  (KR)  .................. 10-2005-0077385

(51) Int. Cl.
   *G11C 11/34* (2006.01)
(52) U.S. Cl. ............... 365/185.18; 365/185.21; 365/185.25; 365/185.26; 365/185.33
(58) Field of Classification Search ............ 365/185.18, 365/185.21, 185.23, 185.29, 185.33, 185.17, 365/185.26, 185.25
   See application file for complete search history.

(56) References Cited

U.S. PATENT DOCUMENTS

| | | | | |
|---|---|---|---|---|
| 5,287,536 A * | 2/1994 | Schreck et al. | ......... | 365/185.23 |
| 5,428,568 A * | 6/1995 | Kobayashi et al. | ..... | 365/185.23 |
| 5,798,966 A * | 8/1998 | Keeney | ................. | 365/185.18 |
| 5,822,252 A * | 10/1998 | Lee et al. | ................ | 365/185.23 |
| 6,144,584 A * | 11/2000 | Kunori et al. | .......... | 365/185.18 |
| 6,331,949 B1 * | 12/2001 | Hirano | ................... | 365/185.09 |
| 6,373,750 B1 * | 4/2002 | Kurosaki | ............... | 365/185.18 |
| 6,452,837 B2 * | 9/2002 | Mori et al. | ............. | 365/185.23 |
| 6,542,412 B2 * | 4/2003 | Ogura et al. | ........... | 365/185.33 |
| 6,654,294 B2 * | 11/2003 | Jeong | ..................... | 365/185.23 |
| 6,671,208 B2 * | 12/2003 | Sumitani et al. | ....... | 365/185.23 |
| 6,680,865 B2 * | 1/2004 | Watanabe | .............. | 365/185.26 |
| 6,831,860 B2 * | 12/2004 | Lee et al. | ............... | 365/185.29 |
| 6,888,745 B2 * | 5/2005 | Ehiro et al. | ............ | 365/185.29 |
| 6,898,120 B2 * | 5/2005 | Natori | .................... | 365/185.23 |
| 6,925,009 B2 * | 8/2005 | Noguchi et al. | ........ | 365/185.17 |
| 6,940,759 B2 * | 9/2005 | Tsang et al. | ............ | 365/185.23 |
| 7,142,458 B2 * | 11/2006 | Inoue | ..................... | 365/185.29 |
| 7,177,190 B2 * | 2/2007 | Lee | ........................ | 365/185.29 |
| 7,269,068 B2 * | 9/2007 | Chae et al. | ............. | 365/185.17 |

FOREIGN PATENT DOCUMENTS

| | | |
|---|---|---|
| JP | 2003-109389 | 4/2003 |
| JP | 2003-123493 | 4/2003 |
| KR | 1020040063300 A | 7/2004 |

* cited by examiner

*Primary Examiner*—Trong Phan
(74) *Attorney, Agent, or Firm*—Harness, Dickey & Pierce, PLC

(57) ABSTRACT

A nonvolatile semiconductor memory device may include a cell array and a program modulation unit. The cell array may further include a plurality of word lines, a plurality of bit lines, a plurality of cell transistors and a plurality of source lines. The plurality of bit lines may intersect the plurality of word lines. The plurality of cell transistors may be arranged at intersections of the word lines and bit lines, and may have drains and gates connected to the bit lines and the word lines, respectively. The source lines may be connected to sources of the plurality of cell transistors. The program-voltage modulation unit may modulate a program voltage based on a number of cell transistors selected for programming.

17 Claims, 5 Drawing Sheets

NONVOLATILE SEMICONDUCTOR MEMORY DEVICES

PRIORITY STATEMENT

This non-provisional patent application claims priority under 35 U.S.C. § 119 to Korean Patent Application No. 10-2005-0077385 filed on Aug. 23, 2005 in the Korean Intellectual Property Office (KIPO), the entire contents of which are incorporated herein by reference.

BACKGROUND OF THE INVENTION

1. Field of the Invention

Example embodiments of the present invention relate to nonvolatile semiconductor memory devices, for example, nonvolatile semiconductor memory devices providing a more stable program voltage to a source line.

2. Description of the Conventional Art

A conventional NOR-type nonvolatile semiconductor memory device may include nonvolatile memory cell transistors. Each nonvolatile memory cell transistor may include a control gate connected to a word line, a drain connected to a bit line, a source connected to a source line and a floating gate. Conventional NOR-type nonvolatile memory cell transistors may comprise an array of a plurality of memory cells arranged in a matrix. The sources of a plurality of cell transistors may be connected to a single common source line. The sources of the cell transistors in different word lines may be arranged opposite each other in order to share the source line.

Read, erase and program (write) operations may be performed on conventional NOR-type nonvolatile semiconductor memory devices. The program operation may be performed by accumulating electrons in the floating gate of a memory cell transistor. Upon programming, a voltage may be applied to a corresponding control gate and drain, and logic high (voltage) may be applied to a source line, so that the cell transistor may conduct electricity, and thus, channel hot electron (CHE) injection may be performed on the floating gate. However, because sources the cell transistors are connected to a single common source line, the voltage drop in the source line when programming may vary depending on the number of cell transistors to be programmed. Furthermore, if the voltage applied to the source line of respective cell transistors increases upon programming, a disturbance may occur in cell transistors not selected for programming and connected to the same source line as the cell transistors selected for programming.

SUMMARY OF THE INVENTION

Example embodiments of the present invention relate to nonvolatile semiconductor memory devices that may provide a more stable program voltage to a source line.

According to at least one example embodiment of the present invention, a nonvolatile semiconductor memory device may include a cell array and a program voltage modulation unit. The cell array may include a plurality of word lines, a plurality of bit lines, a plurality of cell transistors and a plurality of source lines. The plurality of bit lines may intersect the word lines, and the plurality of cell transistors may be arranged at intersections of the bit lines and the word lines. The cell transistors may be configured to have drains and gates connected to the bit lines and the word lines. The source lines may also be connected to sources of the cell transistors. The program-voltage modulation may provide a program voltage modulated in response to a number of cell transistors selected for programming. The modulated program voltage may be input to a source line of the cell array.

A nonvolatile semiconductor memory device, according to another example embodiment of the present invention, may include a cell array, a data input unit and a program voltage modulation unit. The cell array may further include a plurality of word lines, a plurality of bit lines, a plurality of cell transistors and a plurality of source lines. The plurality of bit lines may intersect the word lines, and the cell transistors may be arranged at intersections of the bit lines and word lines. The cell transistors may be configured to have drains and gates connected to the bit lines and the word lines. The source lines may be connected to sources of the plurality of cell transistors. The data input unit may input data of the plurality of cell transistors. The program-voltage modulation unit may modulate a program voltage through a plurality of program current paths having different resistances in response to data input to the cell array by the data input unit. The modulated program voltage may be provided to a source line of the cell array.

A nonvolatile semiconductor memory device, according to another example embodiment of the present invention, may include a cell array, a data input unit and a program-voltage modulation unit. The cell array may include two word lines, a plurality of bit lines, a plurality of cell transistors and a source line. The plurality of bit lines may intersect the two word lines, and the cell transistors may be arranged at intersections of the bit lines and the word lines. The cell transistors may be configured to have drains and gates connected to the bit lines and the word lines. The source line may be connected to sources of the plurality of cell transistors. Sources of the cell transistors may be connected to the two word lines such that vertically adjacent cell transistors share the source line. The program-voltage modulation unit may modulate a program voltage through a plurality of program current paths having different resistances in response to data input from the data input unit. The modulated program voltage may be provided to the source line.

BRIEF DESCRIPTION OF THE DRAWINGS

The present invention will be more clearly understood from the following detailed description of the example embodiments with reference to the drawings in which.

DETAILED DESCRIPTION OF EXAMPLE EMBODIMENTS OF THE PRESENT INVENTION

Figure 1:
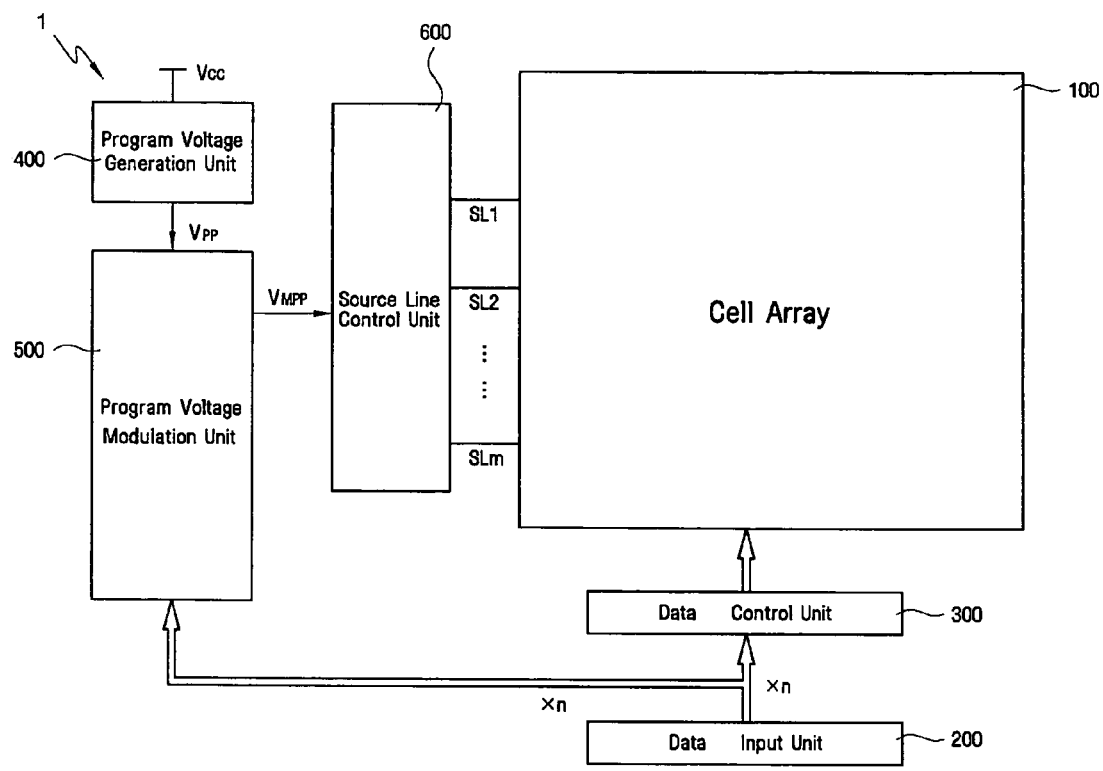
FIG. 1 is a block diagram illustrating a nonvolatile semiconductor memory device according to an example embodiment of the present invention.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the parficular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram illustrating a nonvolatile semiconductor device according to an example embodiment of the present invention. As shown, a nonvolatile semiconductor device 1, according to an example embodiment of the present invention, may include a cell array 100, a data input unit 200, a data control unit 300, a program-voltage generation unit 400, a program-voltage modulation unit 500 and/or a source-line control unit 600.

The cell array 100 may include a plurality of memory cells arranged, for example, in a matrix or matrix form. The cell array 100 may include a plurality of word lines and a plurality of bit lines. The plurality of word lines may be configured to intersect the plurality of word lines. The cell array 100 may further include a plurality of cell transistors arranged at the intersections of the word lines and the bit lines. The cell plurality of cell transistors may be configured to have drains and gates connected to the bit lines and the word lines, respectively. The plurality of source lines may be connected to sources of the plurality of cell transistors. In at least this example embodiment, the cell transistors may be connected such that the sources of cell transistors connected to two different word lines (e.g., two vertically adjacent word lines) may be arranged opposite to each other in order to share one source line. The cell transistors may have a split gate structure.

The data input unit 200 may provide input data to cell transistors selected for programming and to the program-voltage modulation unit 500. The data input unit 200 may include a plurality of input pins. The number of input pins (e.g.,n) may be equal or substantially equal to the number of cell transistors connected to a source line.

The data control unit 300 may provide voltage to a corresponding bit line in response to the data input from the data input unit 200. When the input data is a logic low (e.g., logic 'L' or '0'), a lower voltage (e.g., about 0.4 V) may be trasmitted to corresponding data input and output lines. When the input data is a logic high (e.g., logic 'H' or '1') a power supply level voltage may be transmitted to corresponding data input and output lines. The data control unit 300 may provide a voltage such that cell transistors connected to a corresponding bit line may be programmed when the input data is a logic low, and cell transistors connected to a corresponding bit line may not be programmed when the input data is a logic high.

The program-voltage generation unit 400 may boost a received power supply voltage to provide a program voltage $V_{PP}$ to the program-voltage modulation unit 500. The program-voltage generation unit 400 may include, for example, a charge pump circuit for boosting the power supply voltage.

The program-voltage modulation unit 500 may modulate the received program voltage $V_{PP}$, and provide a modulated program voltage $V_{MPP}$ to the source-line control unit 600. The source-line control unit 600 may provide the modulated program voltage $V_{MPP}$ received from the program-voltage modulation unit 500 to a selected source line. For example, a source line of the cell array 100 selected for programming may receive the modulated program voltage $V_{MPP}$. The source-line control unit 600 may include a source line decoder to select a source line, and a source-line driver circuit to operate the selected source line.

Figure 2:
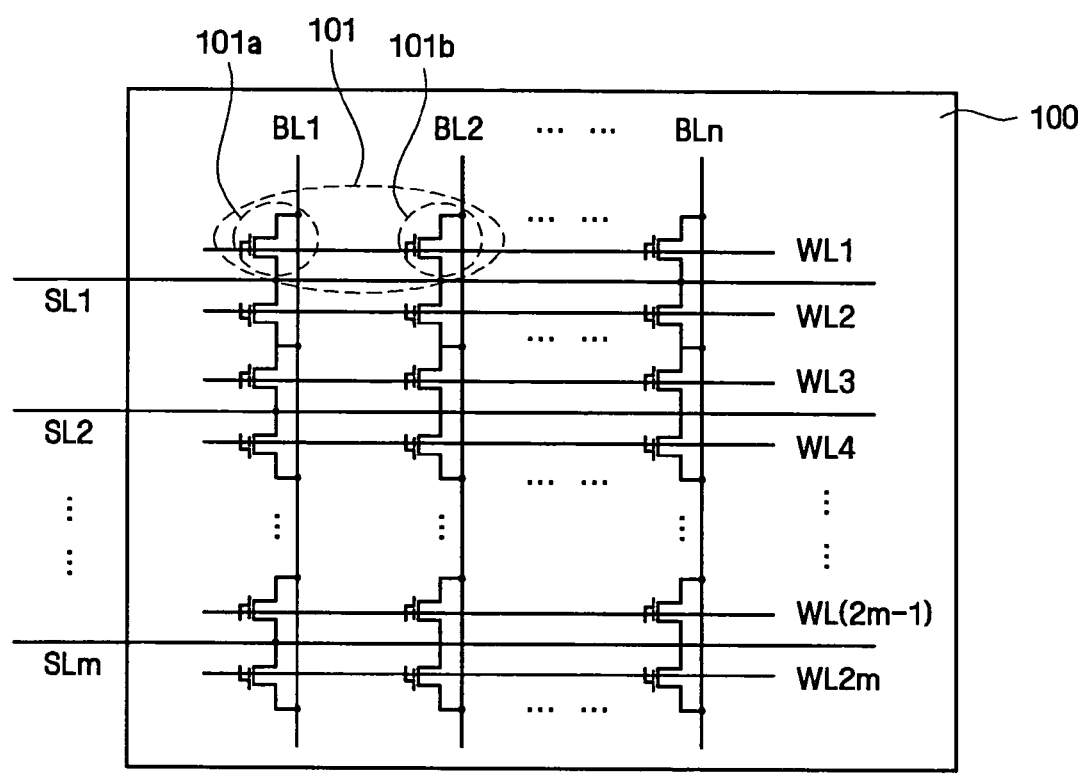
FIG. 2 is a diagram illustrating an example equivalent circuit of a part of a cell array, according to an example embodiment of the present invention.

FIG. 2 is a diagram illustrating the equivalent circuit of a portion of the cell array 100 of FIG. 1. As shown, the cell array 100 may include transistors (e.g., split gate-type cell transistors) connected to n bit lines BL1 to BLn, 2m word lines WL1 to WL2m and m source lines SL1 to SLm. The sources of every two vertically adjacent cell transistors may be connected to a common source line, and the drains of every two vertically adjacent cell transistors may be connected to a common bit line. The gates of each vertically adjacent cell transistor may be connected to a respective one of a plurality of word lines.

For example purposes, a program operation will be described with respect to a first memory cell transistor 101a identified by the circle 101 in FIG. 2. When a voltage is applied to word line WL1, control gates of the cell transistors connected to word line WL1 may be switched on. A logic low may be applied to bit line BL1 intersecting word line WL1 by a data input unit 200 of FIG. 1. When the input data is a logic low, a voltage may be applied to bit line BL1 by data control unit 300 of FIG. 1. The power supply voltage may be applied to bit lines BL2 to BLn, where the input data is a logic high (e.g., a logic 'H' or '1'), by data control unit 300. A higher-level program voltage may be applied to source line SL1 connected to the sources of cell transistors connected to word line WL1. A ground voltage may be applied to word lines WL2 to WL2m and source lines SL2 to SLm.

As a result, memory cell transistor 101a, disposed at the intersections of bit line BL1 and word line WL1, may be programmed. For example, memory cell transistor 101a, disposed at the intersections of bit line BL1 and word line WL1, may be programmed by causing current to flow from source line SL1 to bit line BL1. The remaining cell transistors such as cell transistor 101b may not be programmed because current may not flow from source lines SL2 to SLm to bit lines BL1 to BLn.

For example, if the number of cell transistors to be programmed is one, the voltage drop in the source line SL1 may be smaller. However, if n (e.g., for n >1) cell transistors are programmed, current may flow to n bit lines BL1 to BLn connected to source line SL1, and the voltage drop in the source line SL1 may be larger due to, for example, the channel resistance between source line SL1 and n bit lines BL1 to BLn. The voltage drop in the source line may increase in proportion to the number of cell transistors. Therefore, when the voltage drop in a source line varies, the program voltage of cell transistors to be programmed may also vary. If a higher program voltage is applied, this higher program voltage may cause a disturbance in other cell transistors not being programmed, but connected to the same source line as the cell transistors being programmed.

Figure 3:
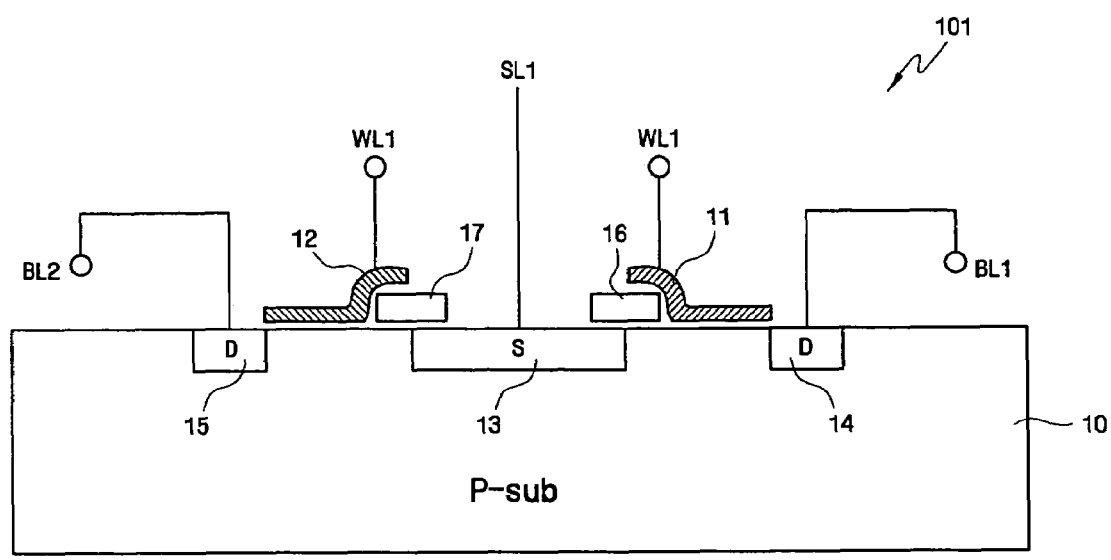
FIG. 3 is a sectional view illustrating two cell transistors having different bit lines and sharing one source line according to an example embodiment of the present invention.

FIG. 3 is a sectional view illustrating two cell transistors 101 having different bit lines and sharing a source line SL1. For example purposes, a disturbance effect that may occur in a nonvolatile semiconductor memory device upon programming will described with reference to FIG. 3. Word line WL1 on a substrate P-sub 10 may be connected to control gates 11 and 12, and may share a source line SL1. The source line SL1 may be connected to a source 13. Bit lines BL1 and BL2 may be connected to drains 14 and 15, respectively. Floating gates 16 and 17 may be formed under or beneath the control gates 11 and 12.

To program the memory cell transistor 101a, a voltage (e.g., about 0.1 V) may be applied to the word line WL1, and another voltage (e.g., about 0.4 V) may be applied to the bit line BL1 of a program cell transistor. A logic high capable of programming may be applied to the source line SL1. The first control gate 11 may be switched on in response to the voltage applied to the word line WL1. If the logic high is applied to the source line SL1, the same or substantially the same voltage may be induced in the first floating gate 16 due to, for example, a coupling effect. For example, the level of the induced voltage may be about 70% of the voltage applied to the source line SL1, and a higher voltage may be induced in the floating gate 16.

Furthermore, current may be generated due to a potential difference between the source 13 and the drain 14. The current may generate hot carriers. Due to the channel hot electron injection caused by the induced voltage in the floating gate 16, electrons may move to the floating gate 16. As a result, a program operation may be performed on the floating gate 16.

A voltage may also be applied to the word line WL1, and a power supply voltage (e.g., a program prohibition voltage) may be applied to bit line BL2. The control gate 12 may be switched off in response to the power supply voltage. The power supply voltage may be higher than the potential difference between the control gate 12 and the drain 15. However, a logic high may also be induced in the floating gate 17 of the cell transistor connected to the unselected bit line BL2 by the source line SL1 due to sharing of the source line SL1 between the cell transistor being programmed and cell transistors not being programmed. This may result in a channel hot electron injection caused by the floating gate 17. If a program voltage modulated by the program-voltage modulation unit, according to at least this example embodiment of the present invention, is provided a nonvolatile semiconductor memory device in which a voltage drop does not occur and/or disturbance to cell transistors not being programmed may be suppressed and/or prevented even if the number of cell transistors being programmed increases.

Figure 4:
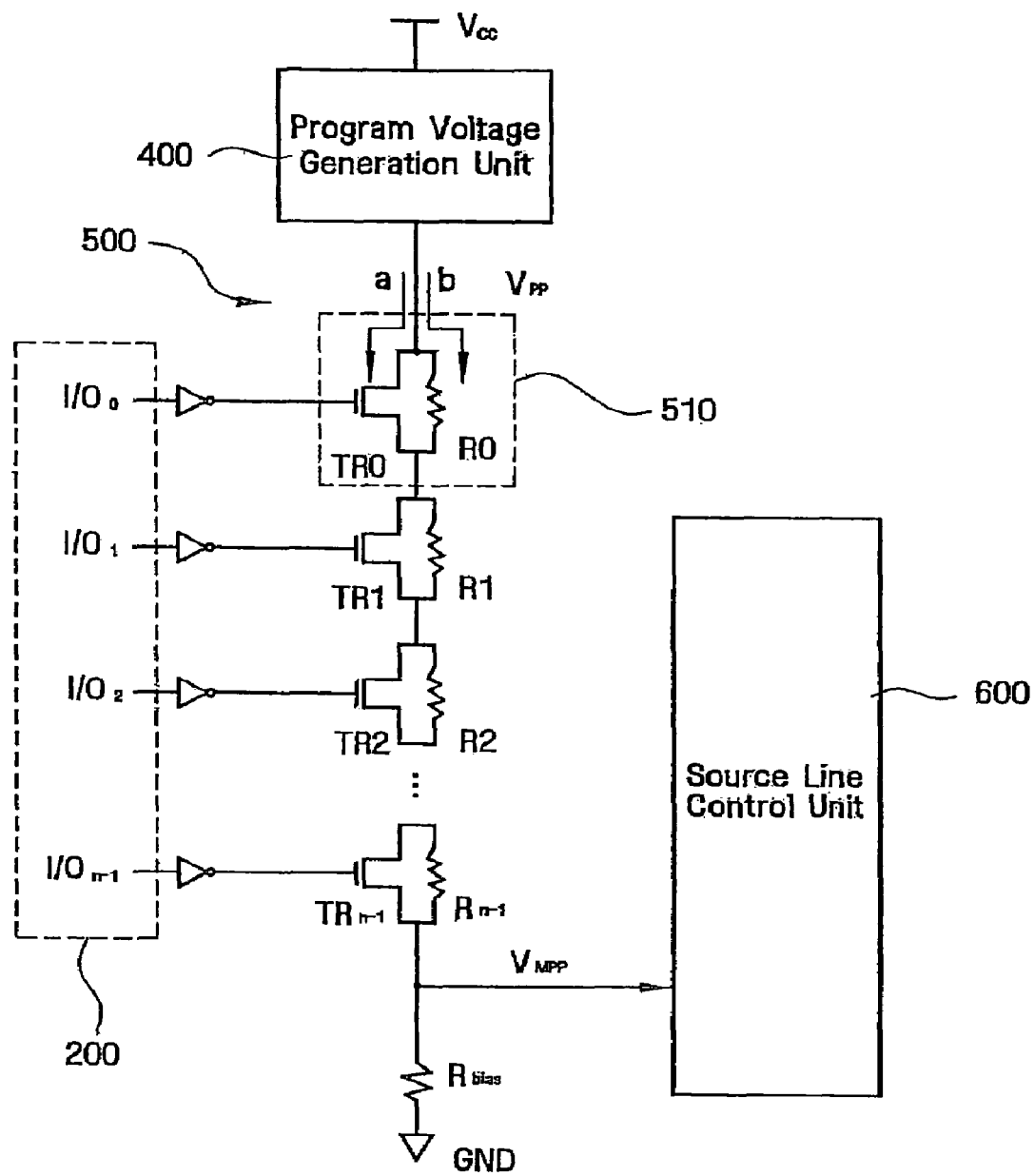
FIG. 4 is a detailed circuit diagram illustrating a program-voltage modulation unit according to an example embodiment of the present invention.

FIG. 4 is a diagram illustrating the program-voltage modulation unit 500 according to an example embodiment of the present invention. The program-voltage modulation unit 500 may modulate a program voltage $V_{PP}$ received from the program-voltage generation unit 400 to generate a modulated program voltage $V_{MPP}$. The program voltage modulation unit 500 may provide the modulated program voltage $V_{MPP}$ to the source-line control unit 600. The program-voltage modulation unit 500 may include a number of current path determination units 510 connected, for example, in series. The number of current path determination units 510 may be equal or substantially equal to the number of data input pins. The current path determination units 510 may provide a plurality of program current paths having different resistances. The number of current paths may be determined based on data input to cell transistors connected to a word line selected for programming. Each of the current path determination units 510 may include a switching element (e.g., a transistor TR) and/or an impedance element. The transistor TR may correspond to the input pin I/O of the data input unit 200, and the impedance element (e.g., a resistor) may be connected, for example, in parallel with the switching element. The program-voltage modulation unit 500, according to at least this example embodiment of the present invention, may modulate the program voltage $V_{PP}$ through the plurality of current path determination units 510. The path through the switching elements may be selected based on and/or in response to data provided to cell transistors selected for programming and connected to a source line. The path through the impedance elements may be selected based on and/or in response to the data provided to cell transistors not selected for programming.

When the input data is a logic low, switching elements may be switched on and a path, in which a voltage drop is less likely, may be selected. If the input data is a logic high, the path through the impedance elements, in which a voltage drop occurs, may be selected. For example, as the number of memory cell transistors selected for programming increases, a higher program voltage may be applied to the source line of the cell array 100.

The n current path determination units 510, which may correspond to n data input pins ($I/O_0, I/O_1, ... I/O_{n-1}$), may provide a program voltage to the source line of the cell array. The program voltage may be modulated through program current paths, and may be provided based on and/or in response to the data provided to the cell transistors selected for programming. For example, the data input unit 200 may receive an inverted input of the n data input pins (I/O) so that program current paths may have different resistances. The current path determination units 510 may be connected, for example, in series and may correspond to the number of input pins. A bias resistor $R_{bias}$ may be formed below the plurality of current path determination units 510 connected in series so that the modulated program voltage $V_{MPP}$ may be provided to the source-line control unit 600. The modulated program voltage $V_{MPP}$ may be modulated in proportion to the ratio of the resistances of the current path determination units 510 to the resistance of the bias resistor $R_{bias}$. In at least this example, the bias resistor $R_{bias}$ may have a resistance that is larger than the sum of resistances of all or substantially all impedance elements of the plurality of current path determination units 510 and/or the resistance of the bias resistor $R_{bias}$ may be equal to, substantially equal to or greater (e.g., about ten times greater) than the sum of resistances of all or substantially all of the impedance elements.

According to example embodiments of the present invention, the switching element may be, for example, an NMOS or PMOS transistor and a resistor may be the impedance element. However, the switching element may be any other suitable switching device, such as, a MOS element, a bipolar element, a diode, etc., and the impedance element may any suitable impedance element, such as, an inductor, a capacitor, etc.

Still referring to FIG. 4, the current path determination unit 510 may determine the program current path of the program voltage $V_{pp}$ provided by the program-voltage generation unit 400. The program voltage $V_{pp}$ may depend on the level of the input data. For example, if the data input to a data pin has a logic low value, the current path determination unit 510 may receive a logic high value. As a result, the switching element TR0 of the current path determination unit 510 may be switched on, and the program current path may be determined to be path 'a' passing through the switching element TR0. In another example, if a logic high value is input to the data pin, the current path determination unit 510 may receive a logic low value, and the switching element TR0 may be switched off. Accordingly, the program current path may be determined to be path 'b' passing through the impedance element R0.

For example, when logic low values are input to the n data pins, voltage across the path which switches on the n switching elements TR0 to TR$n-1$ may be provided to the source-line control unit 600. For example, when the logic low values input via the input pins (I/O) are inverted and the logic high values are received by n current path determination units, all or substantially all n switching elements may be switched on. In this example, the modulated program voltage $V_{MPP}$ provided to the source-line control unit 600 may be:

$$V_{MPP}=IR_{bias}-I*(R_{TR0}+R_{TR1}+\ldots+R_{TRn-1})\cong IR_{bias}, \quad (1)$$

where $R_{TRi}$ is the resistance of an i-th switching element.

The resistance of a switching element TR may be small enough to be negligible and ignored, so that the modulated program voltage $V_{MPP}$ provided to the source-line control unit 600 may have a magnitude equal or substantially equal to the product of the program current I and the bias resistance $R_{bias}$ providing a logic high value or voltage.

If logic high values are input to n data input pins, the voltage across a path via n impedance elements may be provided to the source-line control unit 600. For example, when the logic high values input via the input pins are inverted and logic low values are received by n current path determination units, all or substantially all n switching elements may be switched off and program current may pass through the impedance elements $R_0$ to $R_{n-1}$. In this example, the modulated program voltage $V_{MPP}$ provided to the source-line control unit 600 n may be:

$$V_{MPP}=IR_{bias}-I*(R_0+R_1+\ldots+R_{n-1}), \quad (2)$$

where $R_i$ is the resistance of the i-th impedance element.

As the program voltage passes through the resistors of more impedance elements, a larger voltage drop may occur and the modulated program voltage $V_{MPP}$ may be reduced.

As the number of logic low values input to the data input pins (I/O) increases (e.g., as the number of cell transistors selected for programming and connected to a selected source line increases) a current path switching on more switching elements may be selected, thereby providing a modulated program voltage $V_{MPP}$ (e.g., a logic high value) in which a voltage drop may be less likely.

As the number of logic high values input to the data input pins (I/O) increases (e.g., the number of cell transistors not selected for programming and connected to the selected source line increases), a path passing through more impedance elements, in which a voltage drop occurs, may be selected, thereby providing a lower program voltage $V_{MPP}$.

Although example embodiments of the present invention have been described with regard to specific logic low and logic high values, these values are interchangeable and any suitable logic value may be used. For example, in nonvolatile semiconductor memory devices according to at least some example embodiments of the present invention, as the number of cell transistors to be programmed increases, a higher program voltage $V_{MPP}$ may be provided to a source line. Furthermore, because a lower program voltage $V_{MPP}$ may be provided to cell transistors not selected for programming, a disturbance caused by sharing a source line to which higher voltage may be applied may be suppressed and/or prevented.

Figure 5:
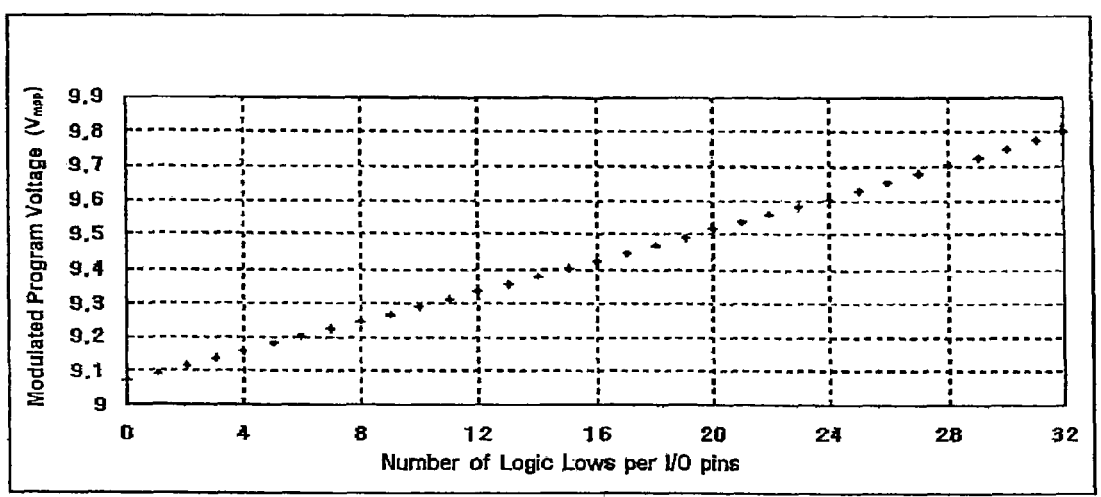
FIG. 5 is a graph illustrating the relationship between the number of pins through which data and the modulated program voltage may be input.

FIG. 5 is a graph illustrating an example relationship between the number of pins through which logic lows are input and the modulated program voltage $V_{MPP}$. As shown, as the number of input pins to which logic low values are applied increases, the modulated program voltage $V_{MPP}$ may also increase. Furthermore, as the number of input pins to which logic low values are applied decreases, the modulated program voltage $V_{MPP}$ may also decrease.

According to at least one example embodiment of the present invention, when a program voltage is applied to a source line connected to a word line selected for programming, the modulated program voltage corresponding to the number of cell transistors selected for programming and connected to the source line may also be applied. A more stable nonvolatile semiconductor memory device may be implemented by applying a modulated program voltage corresponding to the number of cell transistors to be programmed.

In at least some nonvolatile semiconductor memory devices, according to example embodiments of the present invention, as the number of cell transistors selected for programming and connected to a selected source line increases, a higher program voltage may be applied and a program operation may be improved. In at least some nonvolatile semiconductor memory devices, according to example embodiments of the present invention, as the number of cell transistors unselected for programming and connected to a selected source line increases, a lower program voltage may be applied and a disturbance effect may be suppressed and/or prevented.

Although example embodiments of the present invention have been disclosed herein for illustrative purposes, those skilled in the art will appreciate that various modifications,

What is claimed is:

1. A nonvolatile semiconductor memory device comprising:
   a cell array including,
      a plurality of word lines,
      a plurality of bit lines configured to intersect the word lines,
      a plurality of cell transistors, each of the plurality of cell transistors being arranged at an intersections of a word line and a bit line, having a drain connected to the bit line and a gate connected to the word line, and
      a plurality of source lines connected to sources of the plurality of cell transistors;
   a program-voltage modulation unit for modulating a program voltage based on a number of cell transistors selected for programming and providing the modulated program voltage to one of the plurality of source lines; and
   a data input unit for inputting data to the plurality of cell transistors and to the program-voltage modulation unit, wherein
      the program-voltage modulation unit modulates the program voltage through a plurality of program current paths having different resistances in response to the data from the data input unit.

2. The nonvolatile semiconductor memory device as set forth in claim 1, wherein the data input unit includes a number of input pins, the number of input pins being equal to a number of cell transistors connected to the one of the plurality of source lines.

3. The nonvolatile semiconductor memory device as set forth in claim 1, wherein the program-voltage modulation unit includes,
   a plurality of current path determination units connected in series, each of the plurality of current determination units including,
      a switching element corresponding to an input pin of the data input unit, and
      an impedance element connected in parallel with the switching element.

4. The nonvolatile semiconductor memory device as set forth in claim 3, wherein each switching element responds to data from the data input unit, provided to the cell transistors selected for programming.

5. The nonvolatile semiconductor memory device as set forth in claim 3, wherein each impedance element responds to data from the data input unit, provided to the cell transistors selected for programming.

6. The nonvolatile semiconductor memory device as set forth in claim 1, wherein the program-voltage modulation unit increases the program voltage to the one of the plurality of source lines based on the number of cell transistors selected for programming.

7. The nonvolatile semiconductor memory device as set forth in claim 1, further including,
   a program-voltage generation unit for receiving a power supply voltage, boosting the voltage and providing the voltage to the program-voltage modulation unit.

8. A nonvolatile semiconductor memory device comprising:
   a cell array including,
      a plurality of word lines,
      a plurality of bit lines configured to intersect the word lines,
      a plurality of cell transistors, each of the plurality of cell transistors being arranged at an intersections of a word line and a bit line, having a drain connected to the bit line and a gate connected to the word line, and
      a plurality of source lines connected to sources of the plurality of cell transistors;
   a program-voltage modulation unit for modulating a program voltage based on a number of cell transistors selected for programming and providing the modulated program voltage to one of the plurality of source lines; and
   a data input unit for inputting data to a plurality of cell transistors connected to one of the plurality of word lines, wherein
      the plurality of word lines includes two word lines, the plurality of cell transistors are arranged at intersections of the two word lines and the plurality of bit lines and the sources of the plurality of cell transistors are connected to the two word lines arranged opposite each other such that the sources share a source line, and wherein
      the program voltage is provided to a plurality of cell transistors through a plurality of program current paths having different resistances in response to data from the input data unit.

9. The nonvolatile semiconductor memory device of claim 8, wherein the data input unit includes,
   a number of input pins connected to the one of the plurality of source lines, the number of input pins being equal to a number of cell transistors.

10. The nonvolatile semiconductor memory device of claim 8, wherein the program-voltage modulation unit includes,
   a plurality of current path determination units connected in series, each current path determination unit including,
      a switching element corresponding to an input pin of the data input unit, and
      an impedance element connected in parallel with the switching element.

11. The nonvolatile semiconductor memory device of claim 10, wherein each switching element responds to the data from the data input unit, provided to the cell transistors selected for programming.

12. The nonvolatile semiconductor memory device of claim 10, wherein the impedance element responds to data from the data input, provided to the cell transistors selected for programming.

13. The nonvolatile semiconductor memory device of claim 10, wherein each switching element is a transistor.

14. The nonvolatile semiconductor memory device of claim 10, wherein each impedance element is a resistor.

15. The nonvolatile semiconductor memory device of claim 8, wherein the cell transistors have a split gate structure.

16. The nonvolatile semiconductor memory device as set forth in claim 8, wherein the program-voltage modulation unit increases the program voltage to the one of the plurality of source lines based on the number of cell transistors selected for programming.

17. The nonvolatile semiconductor memory device as set forth in claim 8, further including,
   a program-voltage generation unit for receiving a power supply voltage, boosting the voltage and providing the voltage to the program-voltage modulation unit.

* * * * *